US009490785B1

(12) United States Patent
Sridhar et al.

(10) Patent No.: US 9,490,785 B1
(45) Date of Patent: Nov. 8, 2016

(54) PROGRAMMABLE DELAY CIRCUIT FOR LOW POWER APPLICATIONS

(71) Applicant: QUALCOMM, Incorporated, San Diego, CA (US)

(72) Inventors: Shraddha Sridhar, Raleigh, NC (US); Jan Christian Diffenderfer, Escondido, CA (US); Guneet Singh, San Diego, CA (US); Michael Thomas Fertsch, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/705,733

(22) Filed: May 6, 2015

(51) Int. Cl.
*H03H 11/26* (2006.01)
*H03K 5/06* (2006.01)
*H03K 5/13* (2014.01)
*H03K 5/00* (2006.01)

(52) U.S. Cl.
CPC ................ *H03K 5/06* (2013.01); *H03K 5/131* (2013.01); *H03K 2005/00058* (2013.01)

(58) Field of Classification Search
CPC ........ H03K 19/0016; G06F 1/04; G06F 1/10
See application file for complete search history.

(56) References Cited

U.S. PATENT DOCUMENTS

| | | | | |
|---|---|---|---|---|
| 7,486,125 | B2 * | 2/2009 | Chae ...................... | H03K 5/131 327/272 |
| 7,525,356 | B2 | 4/2009 | Hui et al. | |
| 7,932,765 | B2 | 4/2011 | Kapusta et al. | |
| 8,552,783 | B2 | 10/2013 | Rylov | |
| 8,786,340 | B1 | 7/2014 | Yong | |
| 2009/0091360 | A1 * | 4/2009 | Heinimaki ............ | H03K 5/133 327/116 |
| 2014/0103985 | A1 | 4/2014 | Andreev et al. | |

* cited by examiner

*Primary Examiner* — Sibin Chen
(74) *Attorney, Agent, or Firm* — Loza & Loza LLP

(57) ABSTRACT

Programmable delay circuits are described herein according to embodiments of the present disclosure. In one embodiment, a delay circuit comprises a plurality of delay stages coupled in series. Each of the delay stages comprises a delay gate on a forward path of the delay circuit, wherein the delay gate is configured to pass or block a signal on the forward path depending on a logic state of a respective select signal. Each of the delay stages also comprises a multiplexer on a return path of the delay circuit, wherein the multiplexer is configured to pass a signal on the return path or route the signal on the forward path to the return path depending on the logic state of the respective select signal. Output logic states of the delay gates and the multiplexers may remain static during a change in the delay setting of the delay circuit to reduce glitch.

27 Claims, 12 Drawing Sheets

PROGRAMMABLE DELAY CIRCUIT FOR LOW POWER APPLICATIONS

BACKGROUND

Field

Aspects of the present disclosure relate generally to delay circuits, and more particularly, to programmable delay circuits.

Background

Programmable delay circuits are increasingly being employed in a wide range of low power, low latency applications including Double Data Date (DDR) systems. For example, programmable delay circuits may be used in a DDR system to adjust the timing of data signals in order to compensate for skew between the data signals (e.g., due to mismatches in the lengths of their signal paths). In another example, a programmable delay circuit may be used to adjust the timing of a data strobe signal in order to center the data strobe signal in the data eye of a data signal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a delay circuit is described herein. The delay circuit comprises a plurality of delay stages coupled in series. Each of the delay stages comprises a delay gate on a forward path of the delay circuit, wherein the delay gate is configured to pass a signal on the forward path or to block the signal on the forward path depending on a logic state of a respective select signal. Each of the delay stages also comprises a multiplexer on a return path of the delay circuit, wherein the multiplexer is configured to pass a signal on the return path or to route the signal on the forward path to the return path depending on the logic state of the respective select signal. The delay gates and the multiplexers are configured to maintain static output logic states when logic states of one or more of the select signals are changed during a change in a delay setting of the delay circuit.

A second aspect relates to a delay system comprising a delay circuit and a controller. The delay circuit comprises a plurality of delay stages coupled in series. Each of the delay stages comprises a delay gate on a forward path of the delay circuit, wherein the delay gate is configured to pass a signal on the forward path or to block the signal on the forward path depending on a logic state of a respective select signal. Each of the delay stages also comprises a multiplexer on a return path of the delay circuit, wherein the multiplexer is configured to pass a signal on the return path or to route the signal on the forward path to the return path depending on the logic state of the respective select signal. The controller is configured to change logic states of one or more of the select signals to change a delay setting of the delay circuit, wherein the delay gates and the multiplexers are configured to maintain static output logic states when the controller changes the logic states of the one or more of the select signals.

A third aspect relates to a method for changing a delay setting of a delay circuit, wherein the delay setting is controlled by logic states of a plurality of select signals. The method comprises holding an input of the delay circuit at a constant logic state, and flushing out a signal in the delay circuit while the input of the delay circuit is held at the constant logic state. The method also comprises, after the signal is flushed out, changing logic states of one or more of the plurality of select signals to change the delay setting of the delay circuit.

A fourth aspect relates to an apparatus for changing a delay setting of a delay circuit, wherein the delay setting is controlled by logic states of a plurality of select signals. The apparatus comprises means for holding an input of the delay circuit at a constant logic state, and means for flushing out a signal in the delay circuit while the input of the delay circuit is held at the constant logic state. The apparatus also comprises means for, after the signal is flushed out, changing logic states of one or more of the plurality of select signals to change the delay setting of the delay circuit.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Programmable delay circuits are increasingly being employed in a wide range of low power, low latency applications including Double Data Date (DDR) systems. For example, programmable delay circuits may be used in a DDR system to adjust the timing of data signals in order to compensate for skew between the data signals (e.g., due to mismatches in the lengths of their signal paths). In another example, a programmable delay circuit may be used to adjust the timing of a data strobe signal in order to center the data strobe signal in the data eye of a data signal.

A programmable delay circuit typically outputs a glitch when the delay setting of the delay circuit is changed, which is unacceptable in a DDR system. One approach to solve this problem is to gate the output of the delay circuit when the delay setting is changed in order to mask out the glitch. In this approach, the output is gated for a relatively long period of time that exceeds the maximum delay setting of the delay circuit. A drawback of this approach is that traffic needs to be stalled during the long period of time that the output is gated, leading to a huge penalty in terms of system downtime.

Another approach uses a programmable NAND-based delay circuit to delay a signal. In this approach, complex control circuitry is use to prevent a glitch when the delay setting of the delay circuit changes. A drawback of this approach is that the complex control circuitry increases power consumption. In addition, this approach is restricted to changing the delay setting in steps of one.

Figure 1:
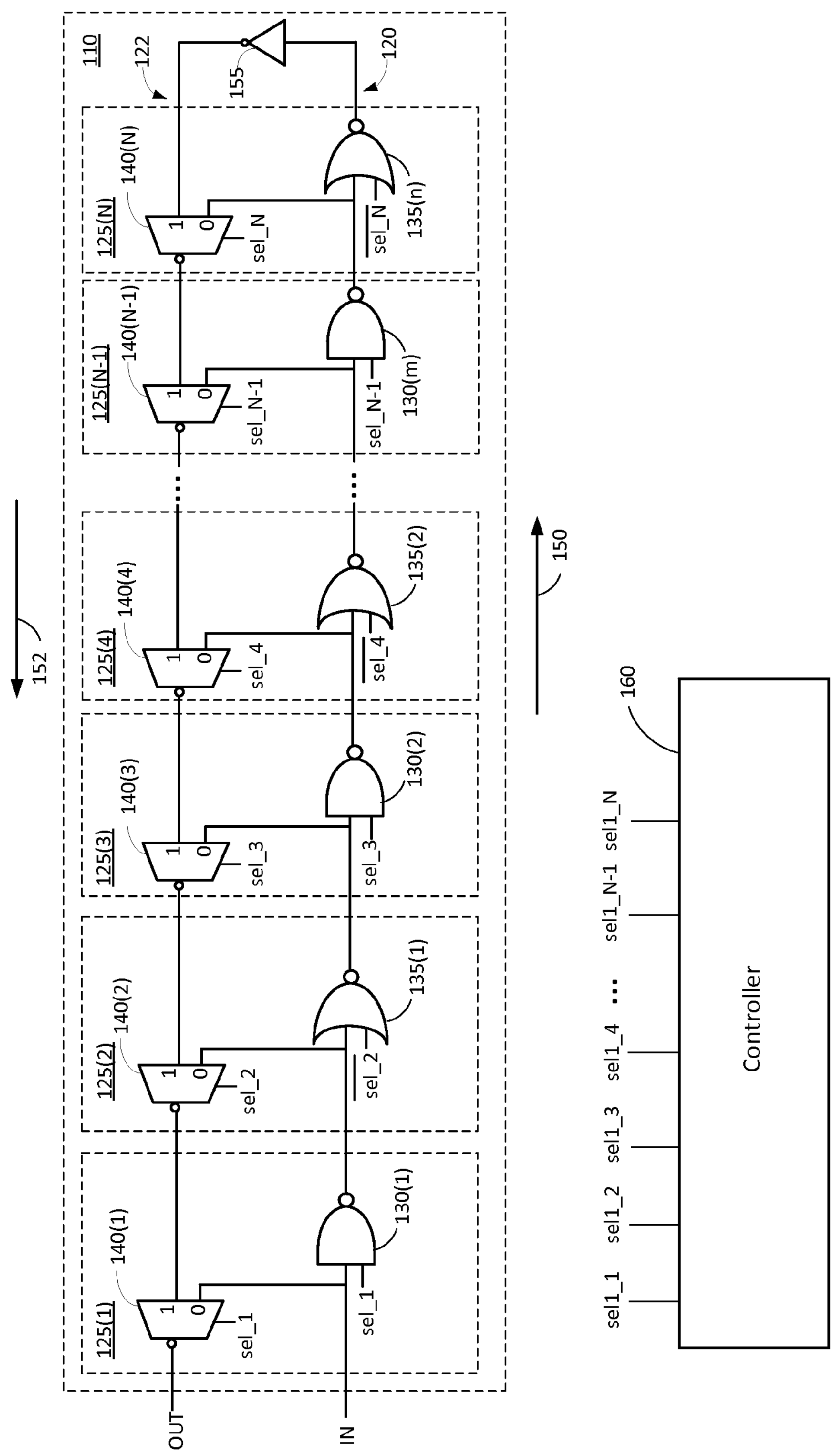
FIG. 1 shows a programmable delay circuit according to an embodiment of the present disclosure.

FIG. 1 shows a programmable delay circuit 110 according to an embodiment of the present disclosure. The delay circuit 110 prevents glitches without employing complex control circuitry, and is capable of being changed between any delay settings in one clock cycle, as discussed further below. The programmable delay circuit 110 may also be referred to as a programmable delay line or other terminology.

The programmable delay circuit 110 comprises a plurality of delay stages 125(1)-125(N) coupled in series. Each of the delay stages 125(1)-125(N) comprises an inverting multiplexer 140(1)-140(N). Each of the odd numbered delay stages 125(1), 125(3), . . . , 125(N−1) comprises a NAND gate 130(1)-130(*m*), and each of the even numbered delay stages 125(2), 125(4), . . . , 125(N) comprises a NOR gate 135(1)-135(*n*). The NAND gates 130(1)-130(*m*) and the NOR gates 135(1)-135(*n*) are arranged along a forward path 120 of the delay circuit 110, in which a signal on the forward path 120 propagates in the direction 150 shown in FIG. 1. The inverting multiplexers 140(1)-140(N) are arranged along a return path 122 of the delay circuit 110, in which a signal on the return path 122 propagates in the direction 152 shown in FIG. 1. The delay circuit 110 may further comprise an inverter 155 coupled between the output of the NOR gate 135(*n*) in the last delay stage 125(N) and the inverting multiplexer 140(N) in the last delay stage 125(N). An inverter (not shown) may be coupled to the output of the delay circuit 110 to invert the output of the delay circuit 110.

Each of the delay stages 125(1)-125(N) receives a respective select signal (denoted "sel") and/or its inverse (denoted "$\overline{\text{sel}}$") from a delay controller 160. The select signals sel_1 to sel_N are used to control the delay setting of the delay circuit 110 by controlling the propagation path of a signal through the delay circuit 110, as discussed further below.

In each of the odd delay stages 125(1), 125(3), . . . , 125(N−1), the respective NAND gate has a first input coupled to the output of the NOR gate in the previous delay stage or the input (denoted "INPUT") of the delay circuit 110, a second input coupled to the respective select signal, and an output coupled to the next delay stage. When the respective select signal is logic one, the respective NAND gate inverts the signal on the forward path 120 and passes the inverted signal to the next delay stage. When the respective select signal is logic zero, the respective NAND gate blocks the signal on the forward path 120 from propagating to the next delay stage. Thus, each NAND gate 130(1)-130(*m*) may be considered an inverting delay gate that is enabled when the respective select signal is logic one and disabled when the respective select signal is logic zero.

In each of the odd delay stages 125(1), 125(3), . . . , 125(N−1), a first input (denoted "1") of the respective inverting multiplexer is coupled to the output of the inverting multiplexer in the next delay stage, and a second input (denoted "0") of the respective inverting multiplexer is coupled to the output of the NOR gate in the previous delay stage or the input of the delay circuit 110. The output of the respective inverting multiplexer is coupled to the first input (1) of the inverting multiplexer in the previous delay stage or the output (denoted "OUTPUT") of the delay circuit 110. The respective inverting multiplexer also receives the respective select signal. When the respective select signal is logic one, the respective multiplexer selects the first input (1), and, when the respective select signal is logic zero, the respective multiplexer selects the second input (0).

In each of the even delay stages 125(2), 125(4), . . . , 125(N), the respective NOR gate has a first input coupled to the output of the NAND gate in the previous delay stage, a second input coupled to the inverse of the respective select signal, and an output coupled to the next delay stage or inverter 155. When the respective select signal is logic one (i.e., inverse of the respective select signal is logic zero), the respective NOR gate inverts the signal on the forward path 120 and passes the inverted signal to the next delay stage or inverter 155. When the respective select signal is logic zero (i.e., inverse of the respective select signal is logic one), the respective NOR gate blocks the signal on the forward path 120 from propagating to the next delay stage. Thus, each NOR gate 135(1)-135(*n*) may be considered an inverting delay gate that is enabled when the respective select signal is logic one and disabled when the respective select signal is logic zero.

In each of the even delay stages 125(2), 125(4), . . . , 125(N), the first input (1) of the respective inverting multiplexer is coupled to the output of the inverting multiplexer in the next delay stage or the output of inverter 155, and the second input (0) of the respective inverting multiplexer is coupled to the output of the NAND gate in the previous delay stage. The output of the respective inverting multiplexer is coupled to the first input (1) of the inverting multiplexer in the previous delay stage. The respective inverting multiplexer also receives the respective select signal. When the respective select signal is logic one, the respective multiplexer selects the first input (1), and, when the respective select signal is logic zero, the respective multiplexer selects the second input (0).

As discussed above, the controller 160 sets the delay of the delay circuit 110 by setting the logic states of the select signals sel_1 to sel_N of the delay stages 125(1)-125(N). The logic states of the select signals sel_1 to sel_N control the delay of the delay circuit 110 by controlling the propagation path of a signal through the delay circuit 110. In this regard, each select signal controls whether the respective delay stage passes the signal on the forward path to the next delay stage or routes the signal on the forward path to the return path. More particularly, when a select signal is logic one, the NAND or NOR gate of the respective delay stage passes the signal on the forward path 120 to the next delay stage. Also, the respective inverting multiplexer passes the signal on the return path. When the select signal is logic zero, the respective inverting multiplexer routes the signal on the forward path 120 to the return path 122. Also, the respective NAND or NOR gate blocks the signal on the forward path 120 from propagating to the next delay stage. In the present disclosure, it is to be understood that passing or routing of a signal may be inverting or non-inverting. In the example in FIG. 1, a signal is inverted when passing through a multiplexer, a NAND gate or a NOR gate.

Figure 2:
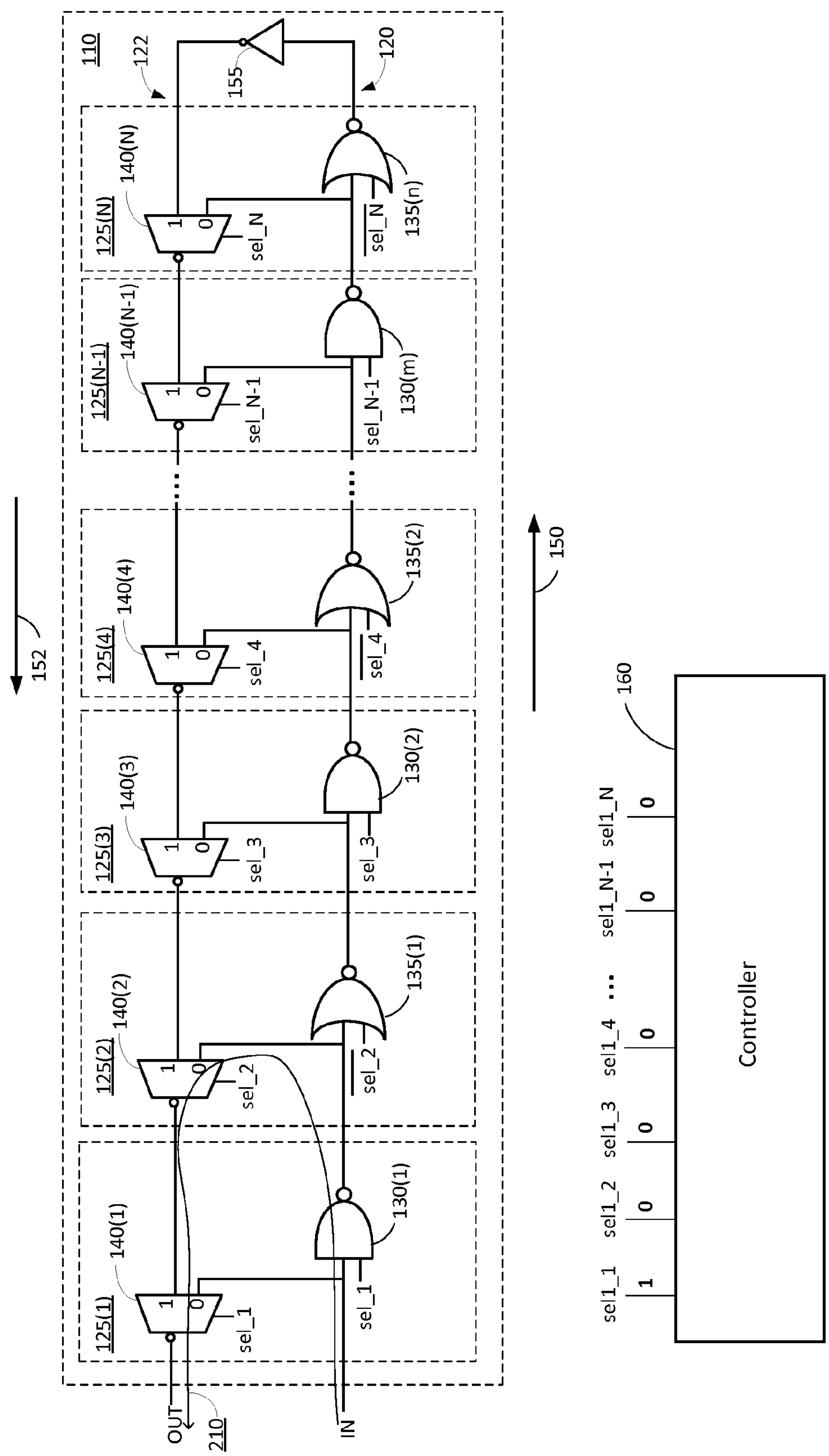
FIG. 2 shows an example in which the programmable delay circuit is set to a first delay according to an embodiment of the present disclosure.

FIG. 2 shows an example in which the controller 160 sets the select signal sel_1 for the first delay stage 125(1) to logic one and sets each of the select signals sel_2 to sel_N for the other delay stages 125(1)-125(N) to logic zero. In this example, the signal input to the delay circuit 110 passes through NAND gate 130(1) and is routed to the return path 122 by inverting multiplexer 140(2). The signal path 210 for this delay setting is shown in FIG. 2. Also shown in FIG. 2 are the logic states of the select signals at the controller 160.

Figure 3:
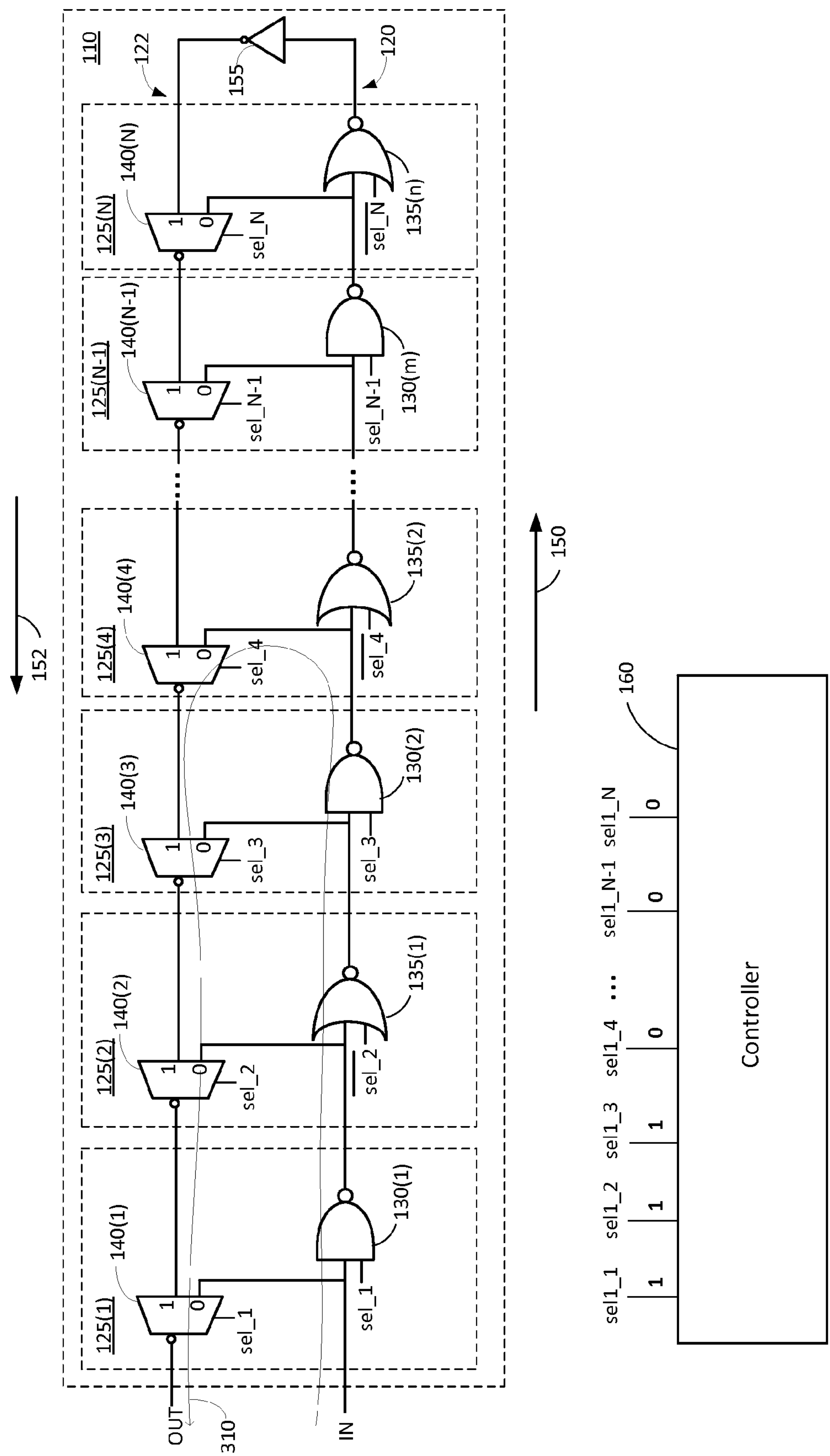
FIG. 3 shows an example in which the programmable delay circuit is set to a second delay according to an embodiment of the present disclosure.

FIG. 3 shows another example in which the controller 160 sets each of the select signals sel_1 to sel_3 for the first, second and third delay stages 125(1)-125(3) to logic one and sets each of the select signals sel_4 to sel_N for the other delay stages 125(4)-125(N) to logic zero. In this example, the signal input to the delay circuit 210 passes through NAND gate 130(1), NOR gate 135(1) and NAND gate 130(2) and is routed to the return path 122 by inverting multiplexer 140(4). The signal path 310 for this delay setting is shown in FIG. 3. Also shown in FIG. 3 are the logic states of the select signals at the controller 160.

Thus, the controller 160 may set (program) the delay of the delay circuit 110 to any one of a plurality of delays. The shortest delay may correspond to all of the select signals sel_1 to sel_N having a logic state of zero, and the longest delay may correspond to all of the select signals sel_1 to sel_N have a logic state of one. The controller 160 can set the delay of the delay circuit to a delay between the shortest delay and longest delay by setting a corresponding number of consecutive select signals to a logic state of one starting with select signal sel_1. It is to be appreciated that the connections between the controller 160 and the select inputs of the delay circuit 110 are not explicitly shown in FIGS. 1-3 for ease of illustration. It is also to be appreciated that the controller 160 may also output the inverse of one or more of the select signals to the delay circuit 110.

As discussed above, the delay circuit 110 prevents glitches when the delay setting of the delay circuit 110 is changed. This may be explained using the example in which the delay circuit 110 changes from the delay setting in FIG. 2 to the delay setting in FIG. 3.

Before the delay setting is changed, the controller 160 may gate the input of the delay circuit 110 and hold the input of the delay circuit 110 low (i.e., logic zero). For example, the controller 160 may gate the input using a gating circuit, as discussed further below. A signal (e.g., data signal or clock signal) that is still propagating through the delay circuit 110 at the time the input is gated is allowed to propagate to the output of the delay circuit 110. In other words, the signal is allowed to flush out of the delay circuit 110. The time for the signal to flush out depends on the current delay setting of the delay circuit 110.

Figure 4:
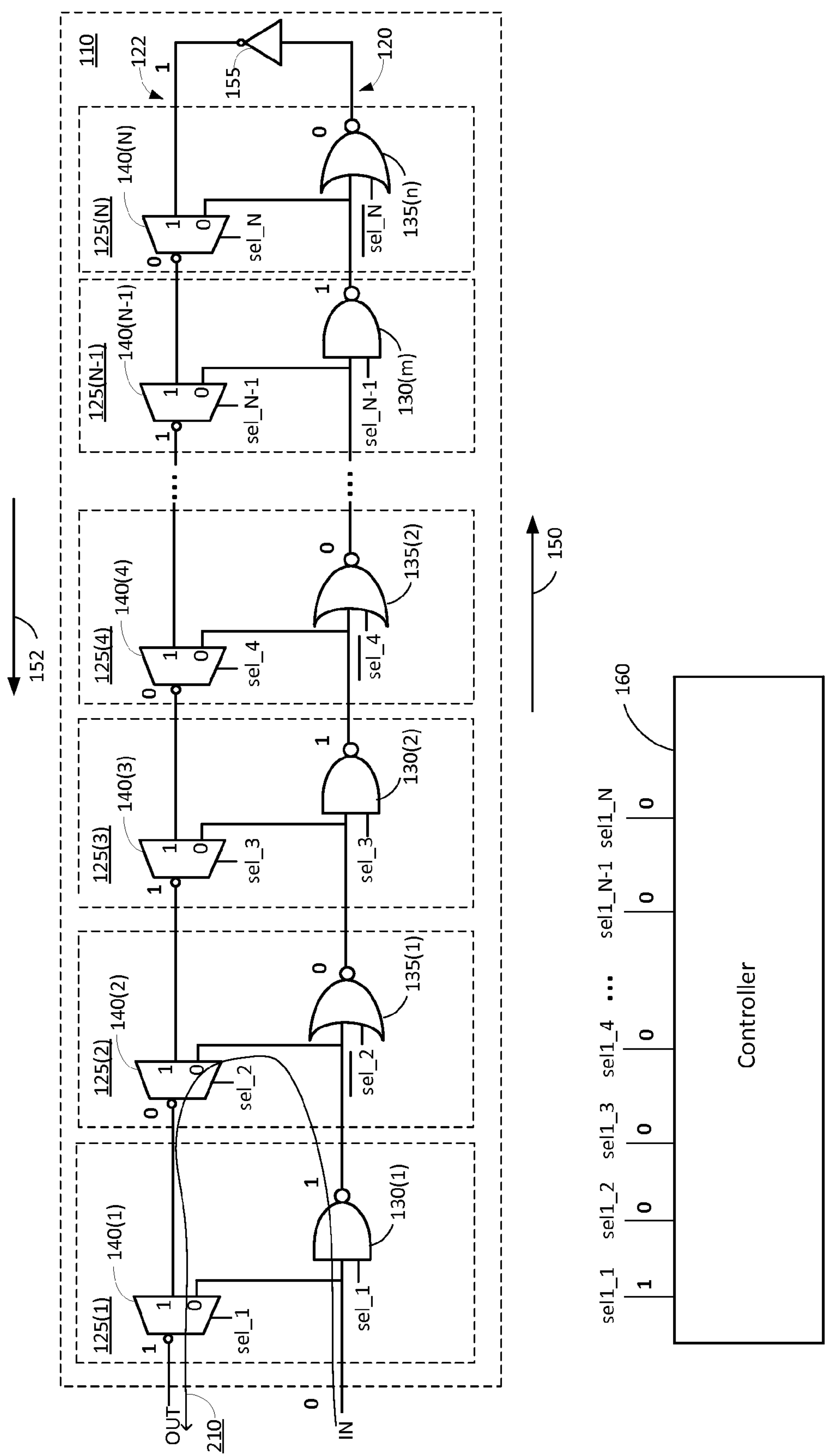
FIG. 4 shows exemplary output logic states in the programmable delay circuit for the first delay according to an embodiment of the present disclosure

Once the signal in the delay circuit 110 is flushed out, the outputs of the NAND gates 130(1)-130(*m*), the outputs of the NOR gates 135(1)-135(*n*), and the outputs of the inverting multiplexers 140(1)-140(N) have the logic states shown in FIG. 4. Also shown in FIG. 4 are the logic states of the select signals at the controller 160. As shown in FIG. 4, the output of each NAND gate 130(1)-130(*m*) has a logic state of one regardless of the logic state of the respective select signal, and the output of each NOR gate 135(1)-135(*n*) has a logic state of zero regardless of the logic state of the respective select signal. This is due to the fact that the NAND gates 130(1)-130(*m*) and NOR gates 135(1)-135(*n*) are arranged in an alternating fashion along the forward path 120 and the input to the first NAND gate 130(1) on the forward path 120 is logic zero. As a result, the output logic states of the NAND and NOR gates do not change (i.e., remain static) when the controller 160 changes the logic states of one or more select signals to change the delay setting of the delay circuit 110.

As shown in FIG. 4, the output logic state of each inverting multiplexer in the odd delay stages 125(1), 125(3), . . . , 125(N−1) is logic one regardless of the logic state of the respective select signal, and the output logic state of each inverting multiplexer in the even delay stages 125(2), 125(4), . . . , 125(N) is logic zero regardless of the output logic state of the respective select signal. Thus, the output logic states of the inverting multiplexers 140(1)-140(N) do not change (i.e., remain static) when the controller 160 changes the logic states of one or more select signals to change the delay setting of the delay circuit 110.

Figure 5:
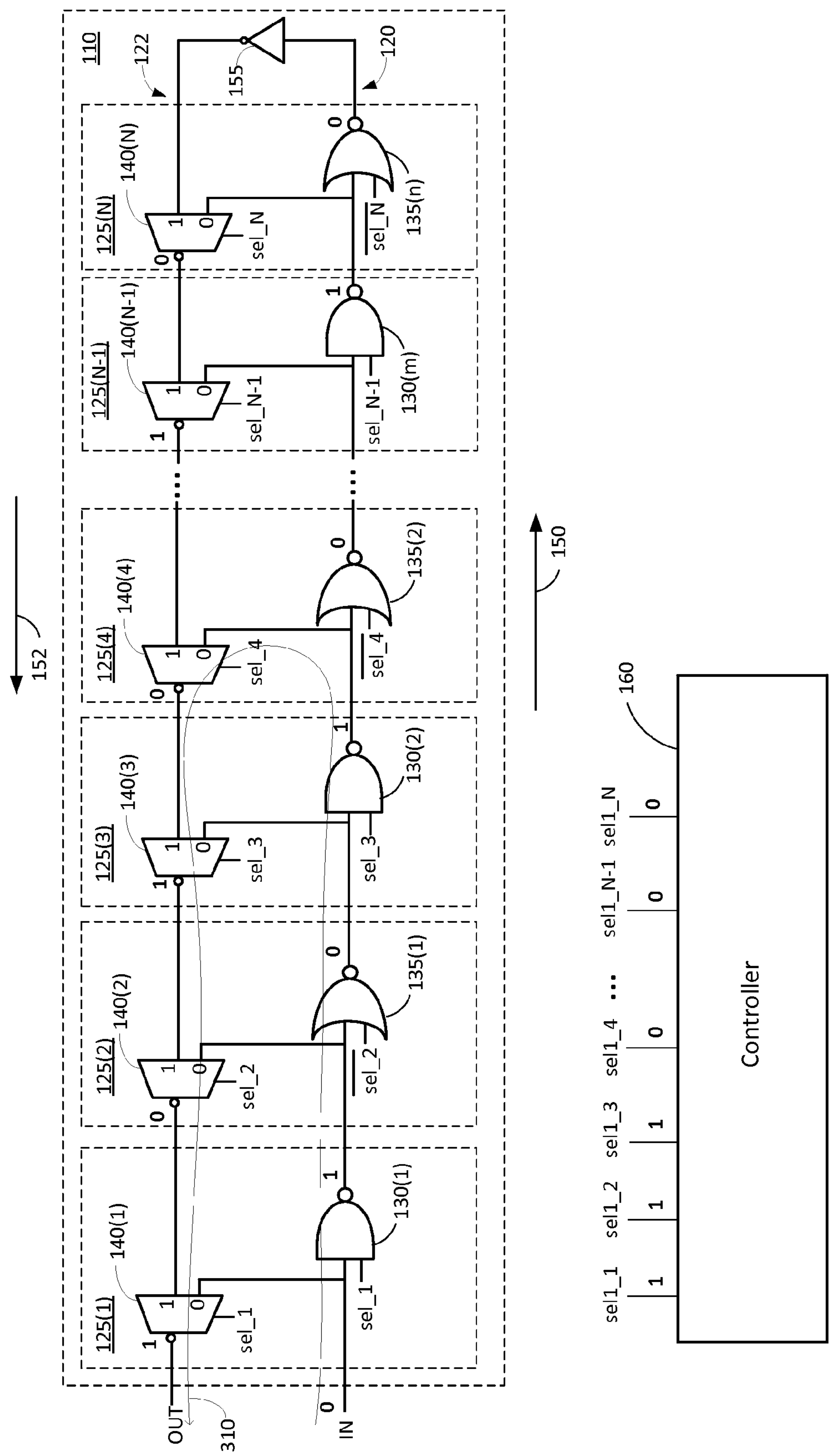
FIG. 5 shows exemplary output logic states in the programmable delay circuit for the second delay according to an embodiment of the present disclosure.

Therefore, the output logic states of the NAND gates 130(1)-130(*m*), the output logic states of the NOR gates 135(1)-135(*n*), and the output logic states of the inverting multiplexers 140(1)-140(N) remain static during a change in the delay setting of the delay circuit 110. This prevents the generation of glitches due to changing logic states in the forward and/or return path of the delay circuit when the delay setting is changed. In this regard, FIG. 5 shows the output logic states of the NAND gates 130(1)-130(*m*), the output logic states of the NOR gates 135(1)-135(*n*), and the output logic states of the inverting multiplexers 140(1)-140(N) after the delay setting is changed from the delay in FIG. 2 to the delay in FIG. 3. Also shown in FIG. 5 are the logic states of the select signals at the controller 160. As can be seen by comparing FIGS. 4 and 5, the output logic states of the NAND gates 130(1)-130(*m*), the output logic states of the NOR gates 135(1)-135(*n*), and the output logic states of the inverting multiplexers 140(1) to 140(N) are the same before and after the delay setting change.

After the delay setting is changed, the input to the delay circuit 110 is ungated. At this point, delay circuit 110 is ready to delay a signal (e.g., data signal or clock signal) by the new delay setting. The delay setting of the delay circuit 110 may be changed from any delay supported by the delay circuit 110 to any other delay supported by the delay circuit 110 by changing the logic states of the select signals accordingly, and is therefore not restricted to changes in steps of one.

Figure 6:
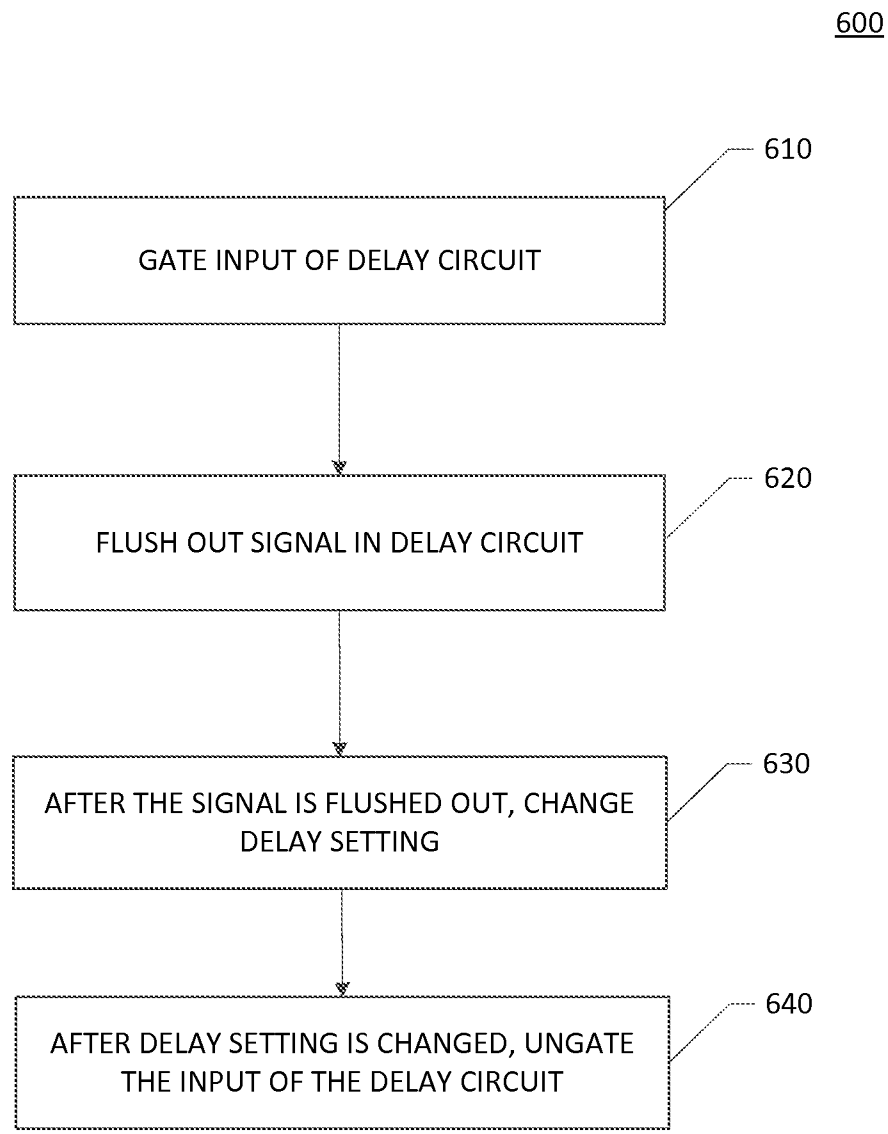
FIG. 6 is a flowchart showing a method for changing delay of a delay circuit according to an embodiment of the present disclosure.

FIG. 6 shows a procedure 600 for changing the delay of delay circuit 110. In step 610, the input to the delay circuit 110 is gated. The input of the delay circuit 110 may be held at logic zero while gated. In step 620, the signal in the delay circuit 110 is flushed out (i.e., a signal (e.g., data signal or clock signal) still in the delay circuit 110 at the time the input is gated is allowed to propagate out of the delay circuit 110). In step 630, after the signal is flushed out of the delay circuit, the delay of the delay circuit is changed. For example, the delay setting of the delay circuit 110 may be changed to any delay supported by the delay circuit by changing the logic states of the select signals accordingly. In step 640, after the delay setting is changed, the input is ungated. At this point, the delay circuit 110 is ready to delay a signal (e.g., data signal or clock signal) according to the new delay setting.

It is to be appreciated that embodiments of the present disclosure are not limited to the examples discussed above. For example, instead of using NAND gates in the odd delay stages and NOR gates in the even stages, NOR gates may be used in the odd delay stages and NAND gates may be used in the even delay stages. In this example, when the input to the delay circuit is gated, the input may be held constant at logic one instead of logic zero since the first delay gate is a NOR gate in this example. After the delay circuit is flushed, the output logic states of the odd delay stages may remain static at zero and the output logic states of the even delay stages may remain static at one during a change in the delay setting of the delay circuit.

Figure 7:
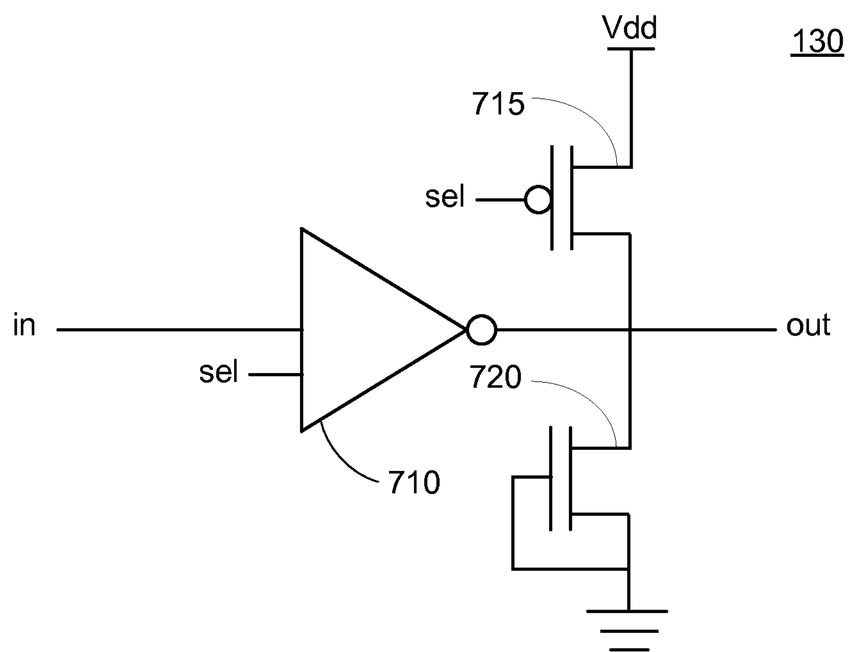
FIG. 7 shows an exemplary implementation of a NAND gate according to an embodiment of the present disclosure.

FIG. 7 shows an exemplary implementation of a NAND gate 130 according to an embodiment of the present disclosure. The NAND gate 130 comprises a tri-state inverter 710 having a first input (denoted "in"), a second input coupled to a select signal sel, and an output (denoted "out"). The NAND gate 130 also comprises a pull-up p-type metal-oxide-semiconductor (PMOS) transistor 715 having a source coupled to a supply voltage Vdd, a gate coupled to the select signal sel, and a drain coupled to the output (out) of the tri-state inverter 710. The NAND gate 130 further comprises a dummy n-type metal-oxide-semiconductor (NMOS) transistor 720 having a drain coupled to the output (out) of the tri-state inverter 710, and a gate and source that are tied together to ground. Since the gate and source of the dummy NMOS transistor 720 are tried together, the dummy NMOS transistor 720 is turned off. As discussed further below, the dummy NMOS transistor 720 is used to provide load balancing between the NAND gates and the NOR gates in the delay circuit 110.

In operation, when the select signal sel is logic one, the tri-state inverter 710 functions as a two-state inverter that inverts the logic state of the signal at the first input (in) and outputs the inverted signal at the output (out). Also, the pull-up PMOS transistor 715 is turned off. Thus, when the select signal sel is logic one, the NAND gate 130 acts as an inverter.

When the respective select signal sel is logic zero, the tri-state inverter 710 has a high output impedance, and the pull-up PMOS transistor 715 is turned on. As a result, the pull-up PMOS transistor 715 pulls up the output of the tri-state inverter 710 to the supply voltage vdd (logic one). Thus, when the respective select signal sel is logic zero, the output of the NAND gate 130 is logic one regardless of the logic state at the first input (in).

The NAND gate 130 may be used to implement any one of the NAND gates 130(1)-130(*m*) in FIG. 1, in which the first input (in) of the tri-state inverter 710 is coupled to the output of the NOR gate in the previous delay stage or the input (IN) of the delay circuit 110, the second input of the tri-state inverter 710 is coupled to the respective select signal, and the output of the tri-state inverter 710 is coupled to the next delay stage.

Figure 8:
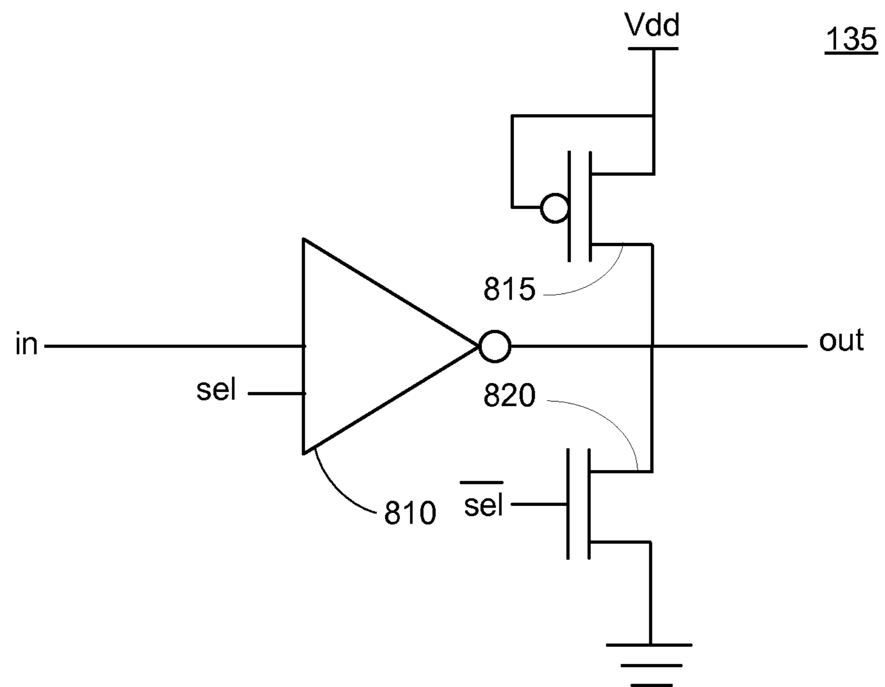
FIG. 8 shows an exemplary implementation of a NOR gate according to an embodiment of the present disclosure.

FIG. 8 shows an exemplary implementation of a NOR gate 135 according to an embodiment of the present disclosure. The NOR gate 135 comprises a tri-state inverter 810 having a first input (denoted "in"), a second input coupled to a select signal sel, and an output (denoted "output"). The NOR gate 135 also comprises a pull-down (NMOS) transistor 820 having a drain coupled to the output (out) of the tri-state inverter 810, a gate coupled to the inverse of the select signal $\overline{\text{sel}}$, and a source coupled to ground. The NOR gate 135 further comprises a dummy PMOS transistor 815 having a drain coupled to the output (out) of the tri-state inverter 710, and a gate and source that are tied together to Vdd. Since the gate and source of the dummy PMOS transistor 815 are tried together, the dummy PMOS transistor 815 is turned off. As discussed further below, the dummy PMOS transistor 815 is used to provide load balancing between the NAND gates and the NOR gates in the delay circuit 110.

In operation, when the select signal sel is logic one, the tri-state inverter 810 functions as a two-state inverter that inverts the logic state of the signal at the first input (in) and outputs the inverted signal at the output (out). Also, the pull-down NMOS transistor 820 is turned off since the inverse of the respective select signal $\overline{\text{sel}}$ (which is input to the gate of the pull-down NMOS transistor 820) is logic zero. Thus, when the respective select signal sel is logic one, the NOR gate 135 acts as an inverter.

When the select signal sel is logic zero, the tri-state inverter 810 has a high output impedance. Also, the pull-down NMOS transistor 820 is turned on since the inverse of the respective select signal $\overline{\text{sel}}$ (which is input to the gate of the pull-down NMOS transistor 820) is logic one. As a result, the pull-down NMOS transistor 820 pulls down the output of the tri-state inverter 810 to ground (logic zero). Thus, when the respective select signal sel is logic zero (i.e., inverse of respective select signal $\overline{\text{sel}}$ is logic one), the output of the NOR gate 130 is logic zero regardless of the logic state at the first input (in).

The NOR gate 135 may be used to implement any one of the NOR gates 135(1)-135(*n*), in which the first input (in) of the tri-state inverter 810 is coupled to the output of the NAND gate in the previous delay stage, the second input of the tri-state inverter 810 is coupled to the respective select signal, and the output of the tri-state inverter 810 is coupled to the next delay stage or inverter 155.

As discussed above, the dummy PMOS transistor 815 and the dummy NMOS transistor 720 are used to provide load balancing between the NAND gate 130 and the NOR gate 135. When the select signal sel of the NAND gate 130 is logic one, the pull-up PMOS transistor 715 is turned off. As a result, the load at the output of the respective tri-state inverter 710 comprises a PMOS transistor 715 and an NMOS transistor 720 that are both turned off. Similarly, when the select signal sel of the NOR gate 135 is logic one, the pull-down NMOS transistor 820 is turned off. As a result, the load at the output of the respective tri-state inverter 710 comprises a PMOS transistor 815 and an NMOS transistor 820 that are both turned off. Thus, when the select signals of the NAND gate 130 and the NOR gate 135 are logic one, the loads at the outputs of their tri-state inverters 710 and 810 may be approximately the same.

Further, the tri-state inverter 710 of the NAND gate 130 may have substantial the same structure as the tri-state inverter 810 of the NOR gate 135. Thus, the tri-state inverters 710 and 810 may have similar driving capabilities. Since the tri-state inverters of the NAND gate 130 and the NOR gate 135 having similar driving capabilities and drive similar loads, their propagating delays may be similar.

Figure 9:
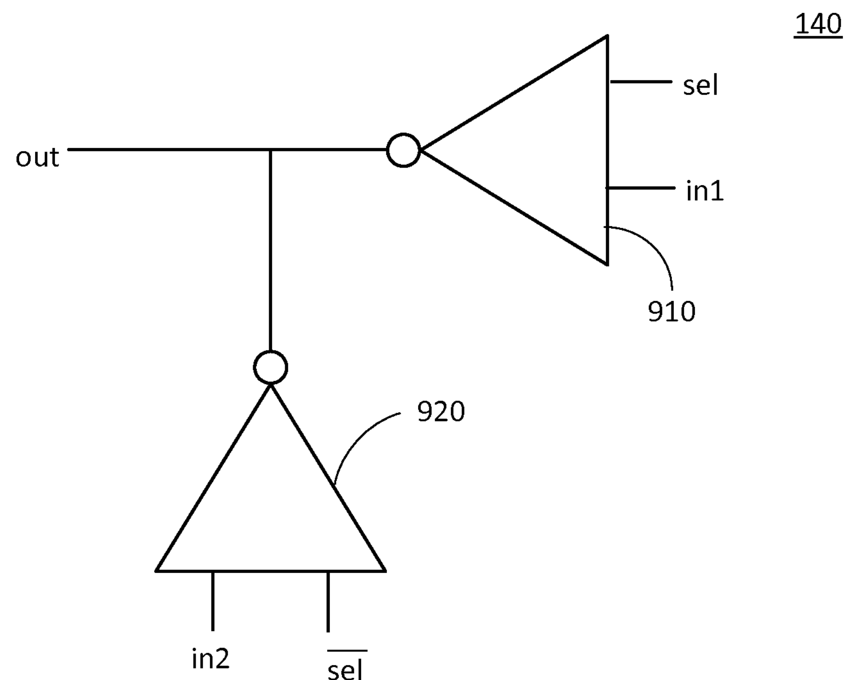
FIG. 9 shows an exemplary implementation of an inverting multiplexer according to an embodiment of the present disclosure.

FIG. 9 shows an exemplary implementation of an inverting multiplexer 140 according to an embodiment of the present disclosure. In this example, the multiplexer 140 has a first input (denoted "in1") and a second input (denoted "in2"). As discussed further below, the inverting multiplexer 140 selects and inverts the signal at either the first input (in1) or the second input (in2) according to a logic state of a select signal sel.

The inverting multiplexer 140 comprises a first tri-state inverter 910, and a second tri-state inverter 920. The first tri-state inverter 910 has one input coupled to the select signal sel and another input corresponding to the first input (in1) of the inverting multiplexer 140. The second tri-state inverter 920 has one input coupled to the inverse of the select signal $\overline{sel}$ and another input corresponding to the second input (in2) of the inverting multiplexer 140. The outputs of the first and second tri-state inverters 910 and 920 are coupled together and form the output of the inverting multiplexer 140.

In operation, when the select signal sel is logic one, the first tri-state inverter 910 inverts the signal at the first input (in1) of the inverting multiplexer 140 and outputs the inverted signal at the output of the inverting multiplexer 140. The second tri-state inverter 920 blocks the signal at the second input (in2) of the inverting multiplexer 140. Thus, when the select signal sel is logic one, the inverting multiplexer 140 selects the signal at the first input (in1).

When the select signal sel is logic zero (i.e., inverse of the select signal $\overline{sel}$ is logic one), the second tri-state inverter 920 inverts the signal at the second input (in2) of the inverting multiplexer 140 and outputs the inverted signal at the output of the inverting multiplexer 140. The first tri-state inverter 910 blocks the signal at the first input (in1) of the inverting multiplexer 140. Thus, when the select signal sel is logic zero, the inverting multiplexer 140 selects the signal at the second input (in2).

The inverting multiplexer 140 may be used to implement any one of the inverting multiplexers 140(1)-140(N) in FIG. 1. For example, the inverting multiplexer 140 may be used to implement any one of the inverting multiplexers in the odd delay stages 125(1), 125(3), . . . , 125(N−1), in which the first input (in1) of the inverting multiplexer 140 is coupled to the output of the inverting multiplexer in the next delay stage, the second input (in2) of the inverting multiplexer 140 is coupled to the output of the NOR gate in the previous delay stage or the input of the delay circuit 110, the output of the inverting multiplexer 140 is coupled to the first input (in1) of the multiplexer in the previous delay stage or the output of the delay circuit, and the inverting multiplexer receives the respective select signal and its inverse. The inverse of the respective select signal may be generated by passing the respective select signal through an inverter (not shown). Further, the inverting multiplexer 140 may be used to implement any one of the inverting multiplexers in the even delay stages 125(2), 125(4), . . . , 125(N), in which the first input (in1) of the inverting multiplexer 140 is coupled to the output of the inverting multiplexer in the next delay stage or the output of inverter 155, the second input (in2) of the inverting multiplexer 140 is coupled to the output of the NAND gate in the previous delay stage, the output of the inverting multiplexer 140 is coupled to the first input (in1) of the multiplexer in the previous delay stage, and the inverting multiplexer receives the respective select signal and its inverse.

Figure 10:
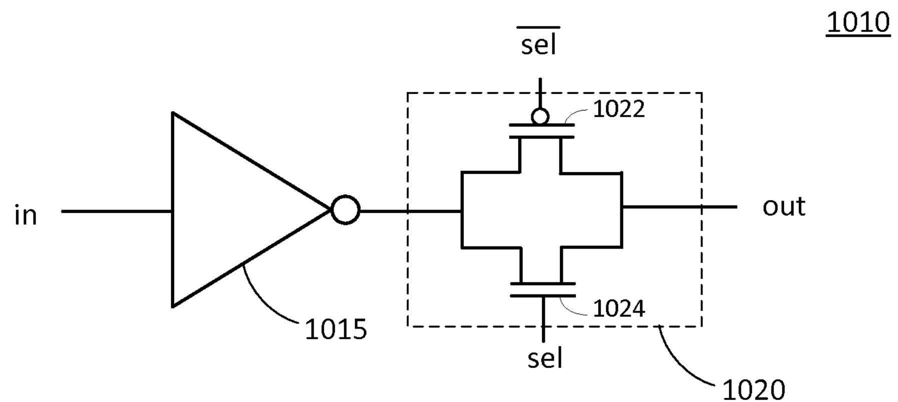
FIG. 10 shows an exemplary implementation of a tri-state inverter according to an embodiment of the present disclosure.

FIG. 10 shows an exemplary implementation of a tri-state inverter 1010 according to an embodiment of the present disclosure. In this example, the tri-state inverter 1010 comprises an inverter 1015 and a transmission gate 1020 coupled to the output of the inverter 1015. The inverter 1015 may be implemented using a CMOS inverter, a current-starved CMOS inverter, or another type of inverter. For the example of a current-starved CMOS inverter, the delay of the inverter may be adjusted by adjusting one or more bias voltages to the inverter.

The transmission gate 1020 (also referred to as a pass gate) comprises an NMOS transistor 1024 and a PMOS transistor 1022 coupled in parallel. In one aspect the NMOS transistor 1024 is driven by a select signal sel, and the PMOS transistor 1022 driven by the inverse of the select signal $\overline{sel}$. The inverse of the select signal may be generated by passing the select signal through an inverter (not shown).

In operation, when the select signal sel is logic one, the PMOS transistor 1022 and the NMOS transistor 1024 in the transmission gate 1020 are turned on. As a result, the transmission gate 1020 provides a signal path between the output of the inverter 1015 and the output (denoted "out") of the tri-state inverter 1010. In this case, the tri-state inverter 1010 inverts the signal at the input (in) and outputs the inverted signal at the output (out). When the respective select signal sel is logic zero, the PMOS transistor 1022 and the NMOS transistor 1024 in the transmission gate 1020 are turned off, thereby blocking the signal at the output of the inverter 1015 from the output of the tri-state inverter 1010.

The tri-state inverter 1010 may be used to implement any one of the tri-state inverters 710 and 810 in the NAND and NOR gates 130 and 135. The tri-state inverter 1010 may also be used to implement the first tri-state inverter 910 in the inverting multiplexer 140. The tri-state inverter 1010 may also be used to implement the second tri-state inverter 920 in the inverting multiplexer 140 by coupling the inverse of the select signal $\overline{sel}$ to the NMOS transistor 1024 in the transmission gate 1020 and coupling the select signal to the PMOS transistor 1024 in the transmission gate 1020. This is because the second tri-state inverter 920 in the inverting multiplexer 140 receives the inverse of the select signal $\overline{sel}$.

Figure 11:
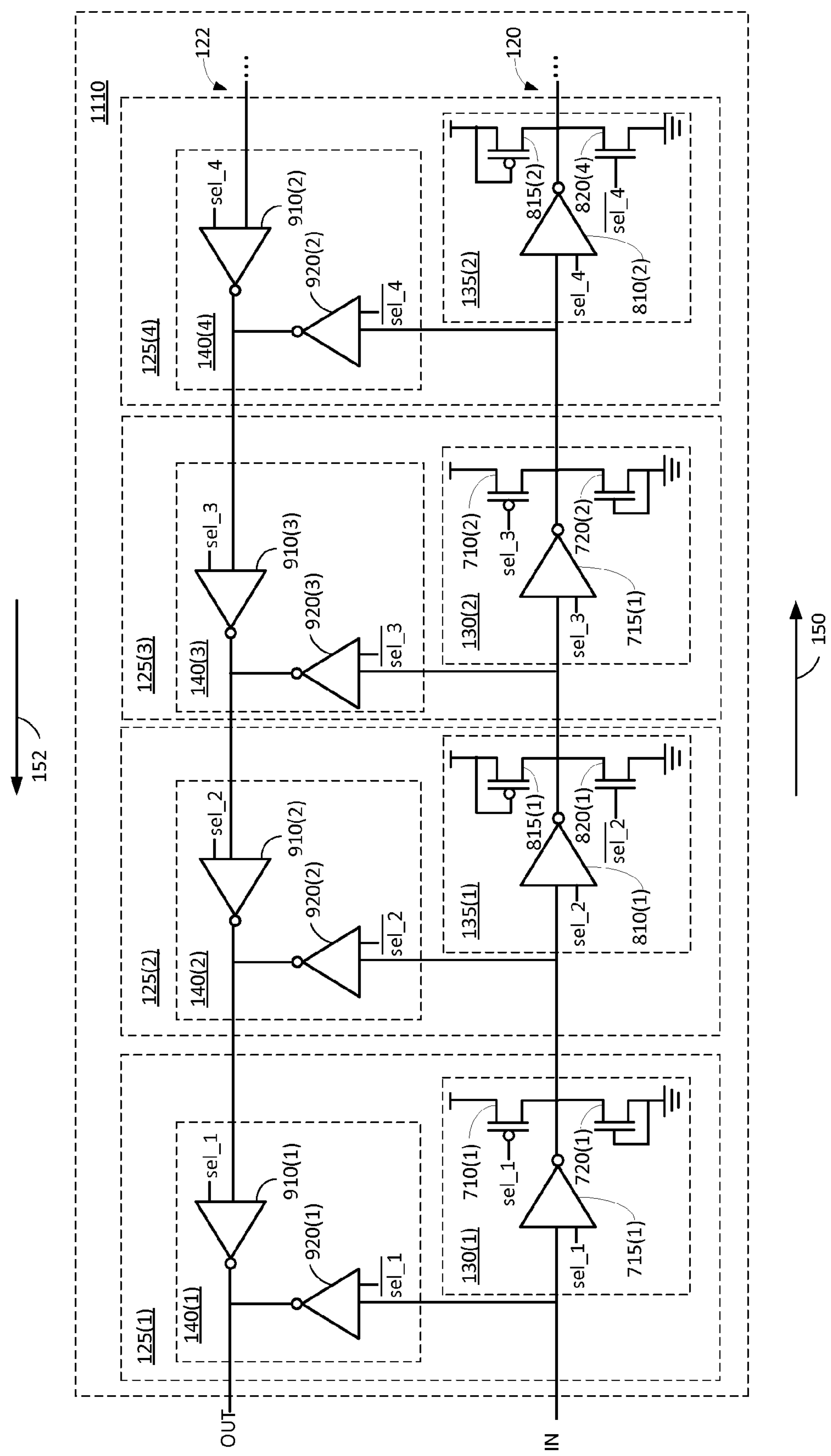
FIG. 11 shows an exemplary implementation of the programmable delay circuit according to an embodiment of the present disclosure.

FIG. 11 shows an exemplary implementation of the programmable delay circuit 1110 according to an embodiment of the present disclosure. For ease of illustration, only the first four delay states 125(1)-125(4) are shown in FIG. 11. In this example, the inverting multiplexer 140(1)-140(N) in each of the delay stages 125(1)-125(N) is implemented using the inverting multiplexer shown in FIG. 9. The NAND gate 130(1)-130($m$) in each of the odd delay stages is implemented using the NAND gate shown in FIG. 7. Lastly, the NOR gate 135(1)-135($n$) in each of the even delay stages is implemented using the NOR gate in FIG. 8. Thus, in this example, each of the delay stages 125(1)-125(N) comprises three tri-state inverters, in which one of the tri-state inverters is on the a forward path 120, one of the tri-state inverters is on the return path 122, one of the tri-state inverters is coupled between the forward and return paths 115 and 120 and 122.

Figure 12:
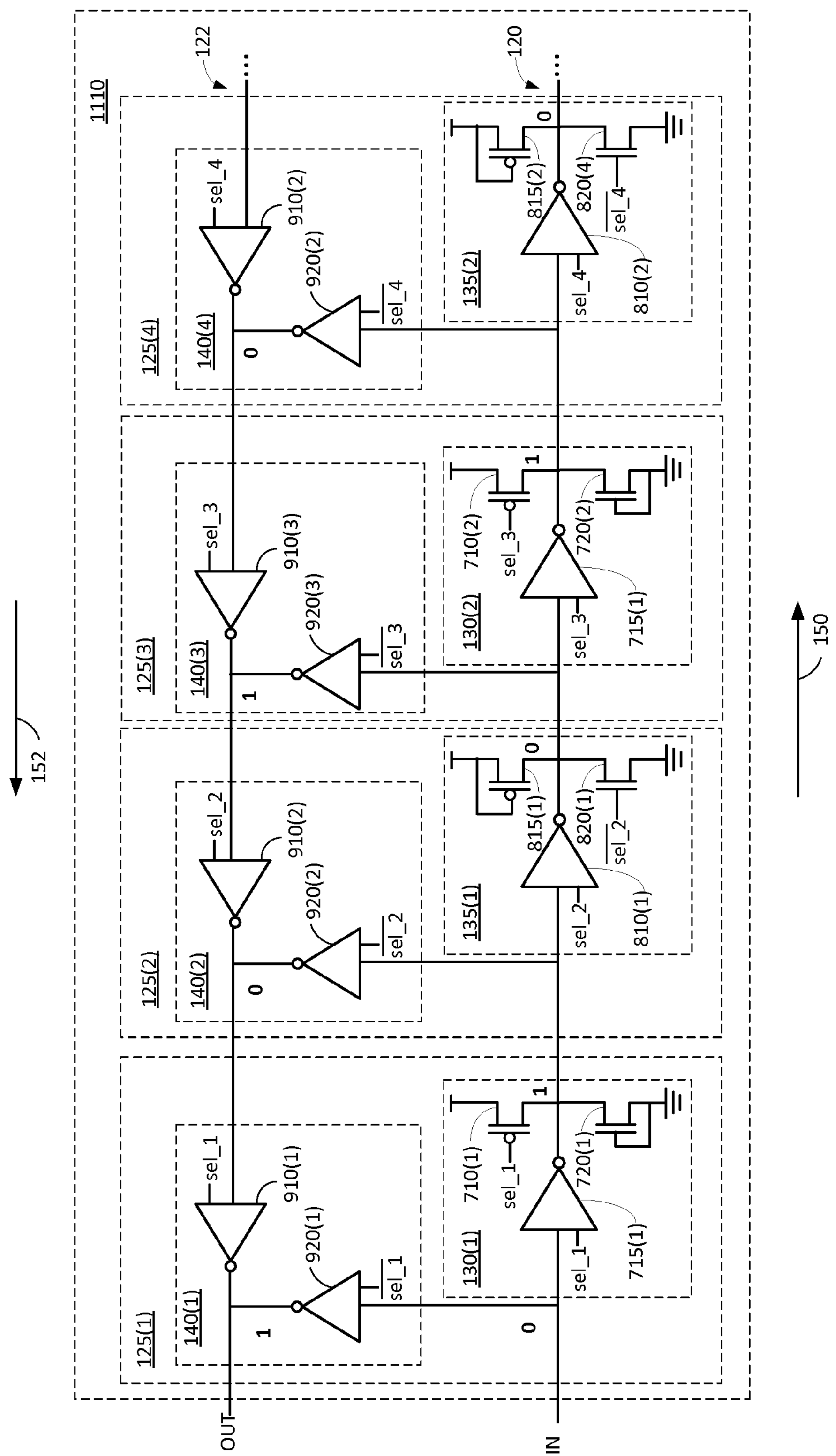
FIG. 12 shows exemplary output logic states in the programmable delay circuit according to an embodiment of the present disclosure.

As discussed above, to change the delay setting of the delay circuit 1110, the input of the delay circuit 1110 may be gated and held at logic zero while gated. Also, a signal in the delay circuit 1110 may be flushed out (i.e., a signal (e.g., data signal or clock signal) still in the delay circuit 1110 at the time the input is gated is allowed to propagate out of the delay circuit 1110). Once the signal is flushed out, the outputs of the tri-state inverters in the delay circuit 1110 have the logic states shown in FIG. 12. As shown in FIG. 12, for each odd delay stage 125(1), 125(3), . . . , 125(N−1), the output logic states of the respective tri-state inverters are logic one regardless of the logic state of the respective select signal. For each even delay stage 125(2), 125(4), . . . , 125(N), the output logic states of the respective tri-state inverters are logic zero regardless of the logic state of the respective select signal. As a result, the output logic states of the tri-state inverters in the delay circuit 1110 do not change when the logic states of one or more select signals are changed to change the delay setting of the delay circuit 1110. In other words, the output logic states of the tri-state inverters remain static during a change in the delay setting of the delay circuit 1110, thereby preventing glitch.

In this example, inverter 155 (not shown in FIG. 11) may be implemented using a tri-state inverter that is enabled. This may be done so that the delay of inverter 155 approximately matches the delays of the other tri-state inverters in the delay circuit 1110.

Figure 13:
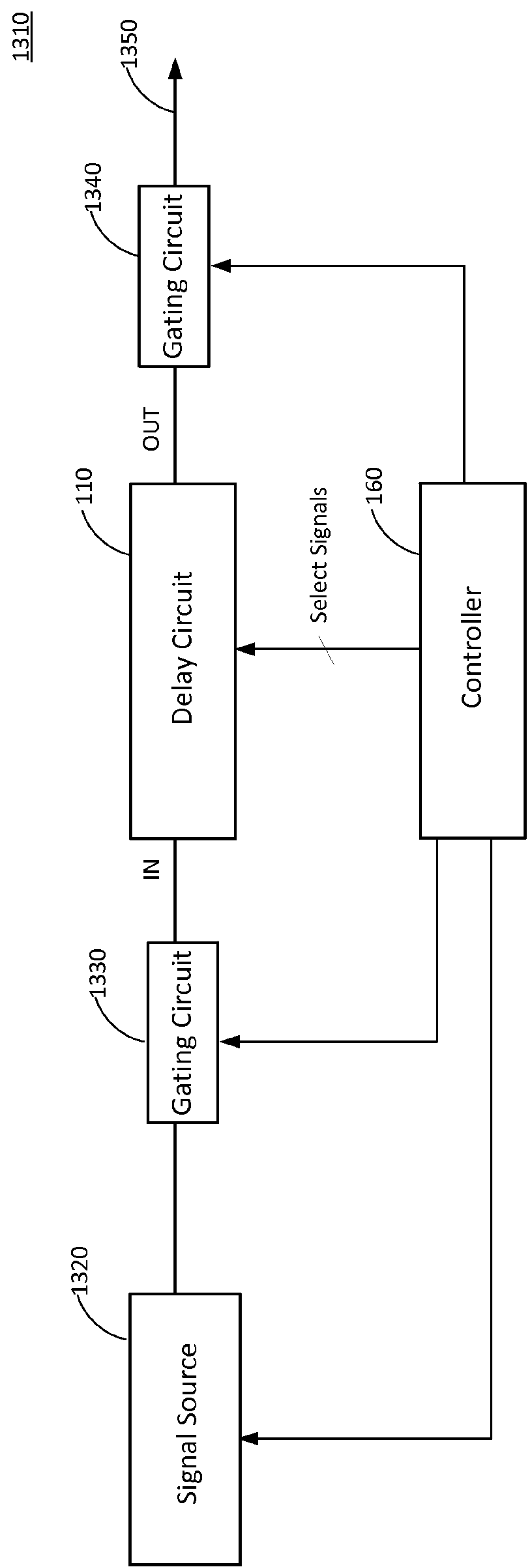
FIG. 13 shows an exemplary system in which embodiments of the present disclosure may be used.

FIG. 13 shows an exemplary system 1310 in which the delay circuit 110 may be used according to embodiments of the present disclosure. The system 1310 may include a signal source 1320, a first gating circuit 1330 between the signal source 1320 and the input of the delay circuit 110, and a second gating circuit 1340 coupled to the output of the delay circuit 110. In this example, the system 1310 may be part of a DDR memory interface or other system in which it is desirable to control the delay of a signal.

The signal source 1320 is configured to produce a signal that is to be controllably delayed by the delay circuit 110. For example, if the signal is a clock signal, the signal source 1320 may comprise a clock generator (e.g., phase locked loop, delay locked loop, crystal oscillator, etc.). In another example, if the signal is a data signal, the signal source 1320 may comprise a data source. The first gating circuit 1330 is configured to gate the input of the delay circuit 110 under the control of the controller 160, and the second gating circuit 1340 is configured to gate the output of the delay circuit 110 under the control of the controller 160. The first gating circuit 1330 and/or the second gating circuit 1340 may be omitted in certain implementations. The output 1350 of the system 1310 may be coupled to a device (not shown) that receives the delayed signal. For example, if the system 1310 is part of a memory interface that interfaces a system on a chip to an external memory device (e.g., external DDR SDRAM memory device), the output 1350 may be coupled to the memory device.

In one example, to change the delay setting of the delay circuit 110, the controller 160 may command the first gating circuit 1330 to gate the input of the delay circuit 110. In response, the first gating circuit 1330 may gate the input and hold the input at a constant logic state (e.g., logic zero for the exemplary implementation shown in FIG. 1). The controller 160 may then allow the signal in the delay circuit 110 to flush out. To do this, the controller 160 may determine the time needed to flush out the signal based on the current delay setting of the delay circuit 110. The time needed to flush out the signal may be approximately equal to the delay corresponding to the current delay setting. After determining the time needed to flush the signal, the controller 160 may wait for a time period approximately equal to the delay before changing the delay setting. The controller 160 may change the delay setting of the delay circuit 110 by changing the logic states of one or more select signals accordingly. After the delay setting is changed, the controller 160 may instruct the first gating circuit 1330 to ungate the input of the delay circuit 110. In this example, the second gating circuit 1340 may be omitted.

In another example, the signal source 1320 may be capable of outputting a constant logic state to the delay circuit 110 under the control of the controller 160. In this example, to change the delay setting of the delay circuit 110, the controller 160 may command the signal source 1320 to output a constant logic state (e.g., logic zero). The controller 160 may then allow the signal (e.g., data signal) in the delay circuit 110 to flush out. After the delay circuit 110 is flushed out, the controller 160 may change the delay setting of the delay circuit 110 by changing the logic states of one or more select signals accordingly. After the delay setting is changed, the controller 160 may inform the signal source 1320 that the new delay setting is ready and the signal source 1320 may resume outputting a signal (e.g., a data signal). In this example, the second gating circuit 1340 may be omitted.

In yet another example, to change the delay setting of the delay circuit 110, the controller 160 may command the second gating circuit 1340 to gate the output of the delay circuit 110. After the output is gated, the controller 160 may set the delay of the controller 160 to the shortest delay (fastest setting) of the delay circuit. For example, the controller 160 may set the delay circuit 110 to the shortest delay by setting the logic states of all of the select signals to zero. This may force the output logic states of the NAND gates, NOR gates and inverting multiplexers in the delay circuit 110 to states that remain static during a delay change (e.g. the output logic states shown in FIG. 4 or FIG. 12). After the delay 160 is set to the shortest delay, the controller 160 may change the delay setting of the delay circuit to a desired delay (e.g., any delay supported by the delay circuit 110). After the delay setting is changed to the desired delay, the controller 160 may command the second gating circuit 1340 to ungate the output of the delay circuit 110.

In this example, a portion of a signal (e.g., data signal or clock signal) that is still propagating in the delay circuit 110 at the time the output of the delay circuit 110 is gated may be lost. In contrast, in the other examples discussed above, the signal in the delay circuit 110 is allowed to flush out before the delay setting is changed. Also, in this example, the controller 1330 may instruct the first gating circuit 1330 to gate the input of the delay circuit 110 during the time the second gating circuit 1340 gates the output of the delay circuit 110. The first gating circuit 1330 may also hold the logic state at the input of the delay circuit constant (e.g., logic zero).

Figure 14:
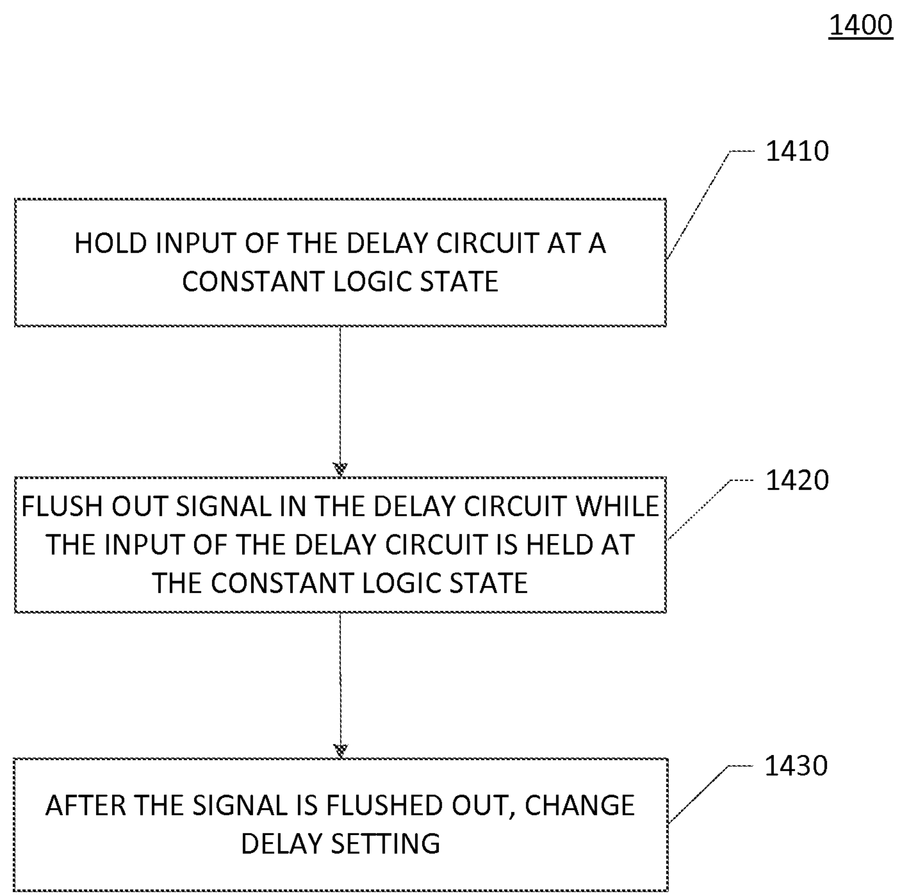
FIG. 14 is a flowchart showing a method for changing delay of a delay circuit according to another embodiment of the present disclosure.

FIG. 14 is a flowchart of a method 1400 for changing a delay setting of a delay circuit, wherein the delay setting is controlled by logic states of a plurality of select signals (e.g., select signals sel_1 to sel_N). The method may be performed by the controller 160.

In step 1410, the input of the delay circuit is held at a constant logic state. For the exemplary delay circuit 110 shown in FIG. 1, the input of the delay circuit 110 may be held constant at logic zero. This may be accomplished, for example, by gating the input of the delay circuit 110 and holding the input low. In another example, this may be accomplished by having the signal source (e.g., data source) output a constant logic value of zero to the delay circuit 110.

In step 1420, a signal in the delay circuit is flushed out of the delay circuit while the input of the delay circuit is held at the constant logic state. For example, the signal may be flushed out by allowing the signal to propagate out of the delay circuit. The time needed to flush out the signal (e.g., data signal or clock signal) in the delay circuit may be approximately equal to a delay corresponding to the current delay setting of the delay circuit.

In step 1430, after the delay circuit is flushed out, logic states of one or more of the plurality of select signals are changed to change the delay setting of the delay circuit. For example, a delay controller (e.g., controller 160) may change the logic states of the one or more select signals (e.g., select signals sel_1 to sel_N) to change the delay setting of the delay circuit to any delay supported by the delay circuit.

It is to be appreciated that the delay controller according to any of the embodiments discussed above may be implemented with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may perform the functions of the delay controller described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A delay circuit, comprising:

a plurality of delay stages coupled in series, wherein each of the delay stages comprises:

a delay gate on a forward path of the delay circuit, wherein the delay gate is configured to pass a signal on the forward path or to block the signal on the forward path depending on a logic state of a respective select signal; and a multiplexer on a return path of the delay circuit, wherein the multiplexer is configured to pass a signal on the return path or to route the signal on the forward path to the return path depending on the logic state of the respective select signal;

wherein the delay gates and the multiplexers in all of the plurality of delay stages are configured to maintain static output logic states regardless of changes to logic states of one or more of the select signals during a change in a delay setting of the delay circuit.

2. The delay circuit of claim 1, wherein the delay gates are inverting and the multiplexers are inverting.

3. The delay circuit of claim 2, wherein one of the multiplexers comprises:

a first tri-state inverter having a first input coupled to an output of another one of the multiplexers on the return path, a second input configured to receive the respective select signal, and a first output; and a second tri-state invert having a third input coupled to an output of one of the delay gates on the forward path, a fourth input configured to receive an inverse of the respective select signal, and a second output coupled to the first output of the first tri-state inverter.

4. A delay circuit, comprising:

a plurality of delay stages coupled in series, wherein each of the delay stages comprises:

a delay gate on a forward path of the delay circuit, wherein the delay gate is configured to pass a signal on the forward path or to block the signal on the forward path depending on a logic state of a respective select signal; and a multiplexer on a return path of the delay circuit, wherein the multiplexer is configured to pass a signal on the return path or to route the signal on the forward path to the return path depending on the logic state of the respective select signal;

wherein the delay gates of the delay stages comprise alternating NAND gates and NOR gates on the forward path.

5. The delay circuit of claim 4, wherein one of the NAND gates comprises:

a first tri-state inverter having a first input coupled to an output of a first one of the NOR gates on the forward path, a second input configured to receive the respective select signal, and an output coupled to an input of a second one of the NOR gates on the forward path; and a pull-up transistor having a source coupled to a supply rail, a gate configured to receive the respective select signal, and a drain coupled to the output of the first tri-state inverter.

6. The delay circuit of claim 5, wherein the one of the NAND gates further comprises a dummy transistor having a drain coupled to the output of the first tri-state inverter, and a gate and a source that are tied together to a ground.

7. The delay circuit of claim 5, wherein the second one of the NOR gates comprises:

a second tri-state inverter having a first input coupled to the output of the one of NAND gate on the forward path, a second input configured to receive the respective select signal, and an output coupled to an input of another one of the NAND gates on the forward path; and a pull-down transistor having a drain coupled to the output of the second tri-state inverter, a gate configured to receive an inverse of the respective select signal, and a source coupled to a ground.

8. The delay circuit of claim 5, wherein the first tri-state inverter comprises:

an inverter coupled to the output of the first one of the NOR gates on the forward path, and an output; and a transmission gate coupled between the output of the inverter and the input of the second one of the NOR gates on the forward path, wherein the transmission gate is configured to pass or block a signal at the output of the inverter depending on the logic state of the respective select signal.

9. The delay circuit of claim 4, wherein one of the NOR gates comprises:

a tri-state inverter having first input coupled to the output of a first one of the NANDs gate on the forward path, a second input configured to receive the respective select signal, and an output coupled to an input of second one of the NAND gates on the forward path; and a pull-down transistor having a drain coupled to the output of the tri-state inverter, a gate configured to receive an inverse of the respective select signal, and a source coupled to a ground.

10. The delay circuit of claim 9, wherein the one of the NOR gates further comprises a dummy transistor having a drain coupled to the output of the tri-state inverter, and a gate and a source that are tied together to a supply rail.

11. A delay system, comprising:

a delay circuit comprising a plurality of delay stages coupled in series, wherein each of the delay stages comprises:

a delay gate on a forward path of the delay circuit, wherein the delay gate is configured to pass a signal on the forward path or to block the signal on the forward path depending on a logic state of a respective select signal; and a multiplexer on a return path of the delay circuit, wherein the multiplexer is configured to pass a signal on the return path or to route the signal on the forward path to the return path depending on the logic state of the respective select signal; and a controller configured to change logic states of one or more of the select signals to change a delay setting of the delay circuit, wherein the delay gates and the multiplexers in all of the plurality of delay stages are configured to maintain static output logic states regardless of changes by the controller to the logic states of the one or more of the select signals.

12. The delay system of claim 11, wherein the delay gates are inverting and the multiplexers are inverting.

13. The delay system of claim 12, wherein one of the multiplexers comprises:

a first tri-state inverter having a first input coupled to an output of another one of the multiplexers on the return path, a second input configured to receive the respective select signal, and a first output; and a second tri-state invert having a third input coupled to an output of one of the delay gates on the forward path, a fourth input configured to receive an inverse of the respective select signal, and a second output coupled to the first output of the first tri-state inverter.

14. The delay system of claim 11, further comprising a gating circuit configured to selectively gate an input of the delay circuit under the control of the controller, wherein the controller is configured to command the gating circuit to gate the input of the delay circuit, to wait for a data signal or a clock signal in the delay circuit to flush out of the delay circuit while the input of the delay circuit is gated, and, after the signal is flushed out, to change the logic states of the one or more of the select signals to change the delay setting of the delay circuit.

15. The delay system of claim 11, further comprising a gating circuit configured to selectively gate an output of the delay circuit under the control of the controller, wherein the controller is configured to command the gating circuit to gate the output of the delay circuit, to set the delay setting of the delay circuit to a first delay, and, after the delay setting of the delay circuit is set to the first delay, to change the logic states of the one or more of the select signals to change the delay setting of the delay circuit to a second delay.

16. The delay system of claim 15, wherein the first delay is a shortest delay of the delay circuit.

17. A delay system, comprising:

a delay circuit comprising a plurality of delay stages coupled in series, wherein each of the delay stages comprises:

a delay gate on a forward path of the delay circuit, wherein the delay gate is configured to pass a signal on the forward path or to block the signal on the forward path depending on a logic state of a respective select signal; and a multiplexer on a return path of the delay circuit, wherein the multiplexer is configured to pass a signal on the return path or to route the signal on the forward path to the return path depending on the logic state of the respective select signal; and a controller configured to change logic states of one or more of the select signals to change a delay setting of the delay circuit;

wherein the delay gates of the delay stages comprise alternating NAND gates and NOR gates on the forward path.

18. The delay system of claim 17, wherein one of the NAND gates comprises:

a tri-state inverter having a first input coupled to an output of a first one of the NOR gates on the forward path, a second input configured to receive the respective select signal, and an output coupled to an input of a second one of the NOR gates on the forward path; and a pull-up transistor having a source coupled to a supply rail, a gate configured to receive the respective select signal, and a drain coupled to the output of the tri-state inverter.

19. The delay system of claim 17, wherein one of the NOR gates comprises:

a tri-state inverter having first input coupled to the output of a first one of the NANDs gate on the forward path, a second input configured to receive the respective select signal, and an output coupled to an input of second one of the NAND gates on the forward path; and a pull-down transistor having a drain coupled to the output of the tri-state inverter, a gate configured to receive an inverse of the respective select signal, and a source coupled to a ground.

20. A method for changing a delay setting of a delay circuit, wherein the delay setting is controlled by logic states of a plurality of select signals, the method comprising:

holding an input of the delay circuit at a constant logic state;

flushing out a signal in the delay circuit while the input of the delay circuit is held at the constant logic state; and after the signal is flushed out, changing logic states of one or more of the plurality of select signals to change the delay setting of the delay circuit;

wherein the delay circuit comprises a plurality of delay stages connected in series, each delay stage including respective one or more delay gates, where the delay gates in all of the plurality of delay stages are configured to maintain static output logic states regardless of changes to logic states of one or more of the select signals during a change in a delay setting of the delay circuit.

21. The method of claim 20, wherein the signal is a data signal or a clock signal.

22. The method of claim 20, further comprising gating the input of the delay circuit, wherein the input of the delay circuit is gated while the signal in the delay circuit is being flushed out of the delay circuit.

23. A method for changing a delay setting of a delay circuit, wherein the delay setting is controlled by logic states of a plurality of select signals, the method comprising:

holding an input of the delay circuit at a constant logic state;

flushing out a signal in the delay circuit while the input of the delay circuit is held at the constant logic state; and after the signal is flushed out, changing logic states of one or more of the plurality of select signals to change the delay setting of the delay circuit;

wherein the delay circuit comprises alternating NAND gates and NOR gates on a forward path of the delay circuit, and output logic states of the NAND gates and the NOR gates remain static when the logic states of the one or more of the plurality of select signals are changed.

24. An apparatus for changing a delay setting of a delay circuit, wherein the delay setting is controlled by logic states of a plurality of select signals, the apparatus comprising:

means for holding an input of the delay circuit at a constant logic state;

means for flushing out a signal in the delay circuit while the input of the delay circuit is held at the constant logic state; and means for, after the signal is flushed out, changing logic states of one or more of the plurality of select signals to change the delay setting of the delay circuit;

wherein the delay circuit comprises a plurality of delay stages connected in series, each delay stage including respective one or more delay gates, where the delay gates in all of the plurality of delay stages are configured to maintain static output logic states regardless of changes to logic states of one or more of the select signals during a change in a delay setting of the delay circuit.

25. The apparatus of claim 24, wherein the signal is a data signal or a clock signal.

26. The apparatus of claim 24, further comprising means for gating the input of the delay circuit, wherein the input of the delay circuit is gated while the signal in the delay circuit is being flushed out of the delay circuit.

27. An apparatus for changing a delay setting of a delay circuit, wherein the delay setting is controlled by logic states of a plurality of select signals, the apparatus comprising:

means for holding an input of the delay circuit at a constant logic state;

means for flushing out a signal in the delay circuit while the input of the delay circuit is held at the constant logic state; and means for, after the signal is flushed out, changing logic states of one or more of the plurality of select signals to change the delay setting of the delay circuit;

wherein the delay circuit comprises alternating NAND gates and NOR gates on a forward path of the delay circuit, and output logic states of the NAND gates and the NOR gates remain static when the logic states of the one or more of the plurality of select signals are changed.

* * * * *